US010206294B2

United States Patent
Nail et al.

(10) Patent No.: US 10,206,294 B2
(45) Date of Patent: Feb. 12, 2019

(54) CHARGE CAPACITOR CIRCUIT CARD ASSEMBLY

(71) Applicant: L3 Technologies Inc., New York, NY (US)

(72) Inventors: David Nail, Flower Mound, TX (US); Matthew J. Spitzner, Lowry Crossing, TX (US); Joel B. Gorman, Allen, TX (US)

(73) Assignee: L3 Technologies Inc., New York, NY (US)

( * ) Notice: Subject to any disclaimer, the term of this patent is extended or adjusted under 35 U.S.C. 154(b) by 0 days.

(21) Appl. No.: 15/449,247

(22) Filed: Mar. 3, 2017

(65) Prior Publication Data

US 2018/0255653 A1   Sep. 6, 2018

(51) Int. Cl.
| | | |
|---|---|---|
| *H05K 7/00* | (2006.01) | |
| *H05K 5/00* | (2006.01) | |
| *H05K 1/18* | (2006.01) | |
| *H05K 3/34* | (2006.01) | |
| *H05K 1/14* | (2006.01) | |
| *H01R 13/24* | (2006.01) | |
| *H01R 12/71* | (2011.01) | |

(52) U.S. Cl.
CPC .......... *H05K 5/0026* (2013.01); *H01R 12/71* (2013.01); *H01R 13/24* (2013.01); *H05K 1/14* (2013.01); *H05K 1/181* (2013.01); *H05K 3/341* (2013.01); *H05K 2201/10015* (2013.01)

(58) Field of Classification Search
CPC .......... H05K 1/14; H05K 1/181; H05K 3/341; H05K 5/0026; H05K 2201/10015; H01R 12/71; H01R 13/24

USPC .................................................. 361/728–730
See application file for complete search history.

(56) References Cited

U.S. PATENT DOCUMENTS

| | | | | |
|---|---|---|---|---|
| 4,668,041 A | * | 5/1987 | La Komski ......... | H01R 13/665 324/755.01 |
| 5,502,397 A | * | 3/1996 | Buchanan ......... | G01R 31/2863 324/756.04 |
| 8,911,266 B2 | * | 12/2014 | Kawate ............. | G01R 1/0483 439/700 |
| 9,039,448 B2 | * | 5/2015 | Mason ............ | H01R 13/65807 439/607.09 |
| 2003/0104641 A1 | * | 6/2003 | Kohno ............... | G01R 1/07314 438/14 |
| 2006/0250150 A1 | * | 11/2006 | Tunaboylu ......... | G01R 1/07378 324/756.03 |
| 2008/0116924 A1 | * | 5/2008 | Blaney .............. | G01R 1/06722 324/754.07 |

* cited by examiner

*Primary Examiner* — Hung S Bui
(74) *Attorney, Agent, or Firm* — Egan Peterman Enders Huston

(57) ABSTRACT

An electronic apparatus comprising: 1) a first circuit board; 2) a second circuit board substantially parallel to the first circuit board; and 3) an electrical assembly coupled between the first and second boards. The electrical assembly comprises: i) a housing; ii) a plurality of pogo pin connectors disposed within and projecting from the housing and configured to make electrical contact with the first and second circuit boards; and iii) a plurality of capacitors disposed within the housing and configured to form electrical connections with selected ones of the plurality of pogo pin connectors.

23 Claims, 6 Drawing Sheets

CHARGE CAPACITOR CIRCUIT CARD ASSEMBLY

TECHNICAL FIELD

The present application relates generally to high power radio frequency (RF) transmitters and, more specifically, to a charge capacitors used in such systems.

BACKGROUND

Increasingly, radar systems and other high power RF transmitter systems are being implemented using higher density circuit card assemblies. The increased density results in higher current consumption and higher power dissipation in a smaller area. Because of the increased power and current requirements, many such systems use a distributed power interconnect that includes pogo pins to distribute power. Also, because of the high current and power requirements, many systems use charge capacitors to store energy close to the point of use.

However, charge capacitors with sufficient capacity to meet the needs of RF systems also have a large footprint, which reduces valuable board space. Unfortunately, because the charge capacitors need to be very close to the point of use, it is generally not an option to move the charge capacitors to a different circuit card assembly.

Therefore, there is a need in the art for improved circuit designs that increase the capacity of charge storage capacitors in an RF circuit assembly without increasing the footprint of the charge capacitors on the board. In particular, there is a need for RF circuit assemblies that provide the same, if not more capacitance, near the point of load while freeing up this valuable board space.

SUMMARY

To address the above-discussed deficiencies of the prior art, it is a primary object to provide an electronic apparatus comprising: 1) a first circuit board; 2) a second circuit board substantially parallel to the first circuit board; and 3) an electrical assembly coupled between the first and second boards, the electrical assembly comprising: i) a housing; ii) a plurality of pogo pin connectors disposed within and projecting from the housing and configured to make electrical contact with the first and second circuit boards; and iii) a plurality of capacitors disposed within the housing and configured to form electrical connections with selected ones of the plurality of pogo pin connectors.

In one embodiment of the disclosure, the electronic apparatus further comprises a printed wiring board on which the plurality of capacitors are mounted.

In another embodiment of the disclosure, wiring traces on a surface of the printed wiring board are connected to the selected ones of the plurality of capacitors.

In still another embodiment of the disclosure, the wiring traces on the surface of the printed wiring board are soldered to the selected ones of the plurality of capacitors.

Before undertaking the DETAILED DESCRIPTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present disclosure and its advantages, reference is now made to the following description taken in conjunction with the accompanying drawings, in which like reference numerals represent like parts.

DETAILED DESCRIPTION

FIGS. 1 through 6, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged circuit card assembly.

The present disclosure describes an improved pogo pin assembly with integrated charge capacitors that provides circuit board-to-circuit board connectivity and further includes additional storage capacitance on a printed wiring board for high current distributed power delivery. The disclosed assembly includes a small printed wiring board running parallel to the pogo pins. Storage capacitors may be mounted on the printed wiring board in an area of unused space. This allows capacitors to be removed from high value circuit board real estate at the point of power delivery on the main printed circuit boards.

Figure 1:
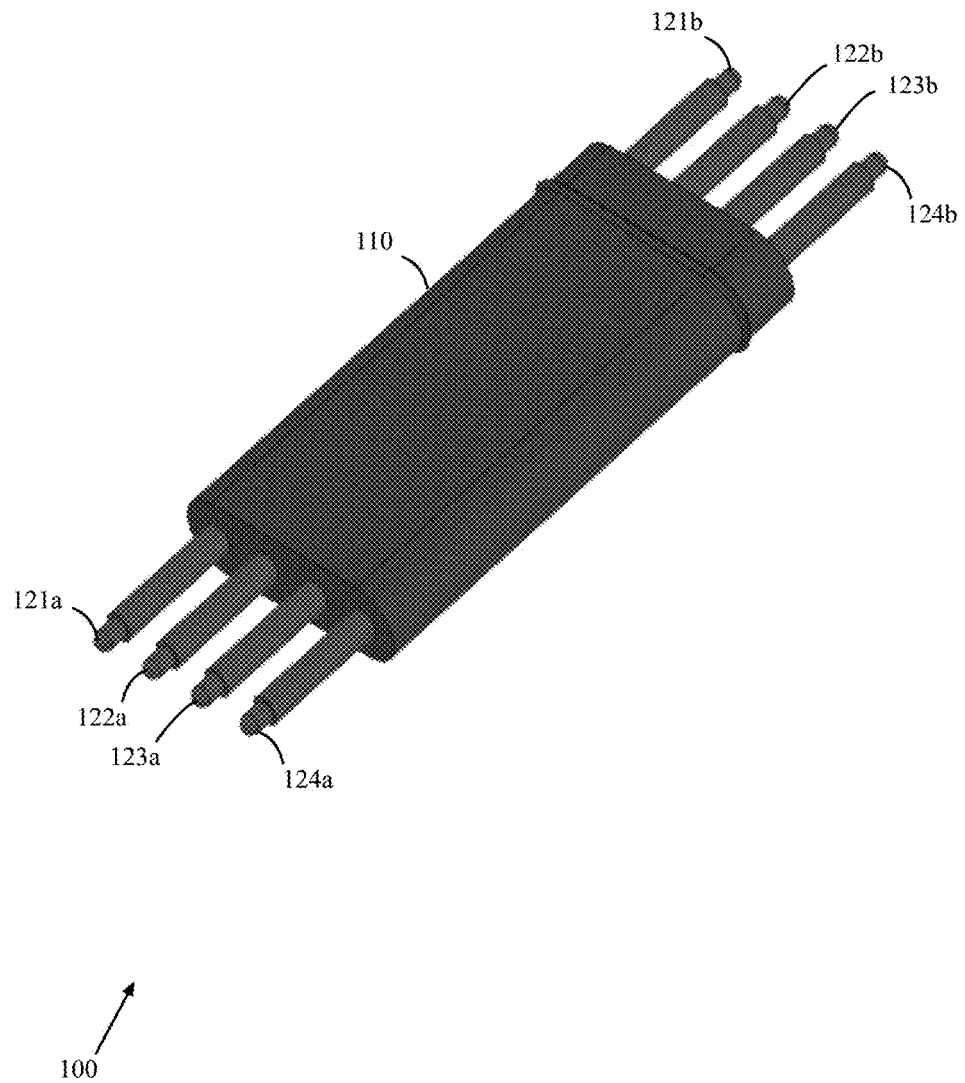
FIG. 1 is a perspective view of a pogo pin connector assembly according to an exemplary embodiment of the prior art.

FIG. 1 is a perspective view of pogo pin connector assembly 100 according to an exemplary embodiment of the prior art. Pogo pin connector assembly 100 comprises a plurality of spring-mounted pogo pins 121-124 encased in housing 110. Pogo pin connector assembly 100 is essentially a solid insulator body (e.g., housing 110) with pogo pin connectors running through it. Each pogo pin connector comprises a cylindrical central body that receives a pogo pin on each end. An internal spring forces the pogo pins outward into contact with external circuit boards (not shown). First pogo pin connector 121 includes distal pins 121*a* and 121*b*, which insert into pin sockets or holes on opposing circuit boards. Similarly, second pogo pin connector 122 includes distal pins 122a and 122b, which insert into pin sockets or holes on the opposing circuit boards and third pogo pin connector 123 includes distal pins 123a and 123b, which insert into pin sockets or holes on the opposing circuit boards. Finally, fourth pogo pin connector 124 includes distal pins 124a and 124b, which insert into pin sockets or holes on the opposing circuit boards.

Figure 2:
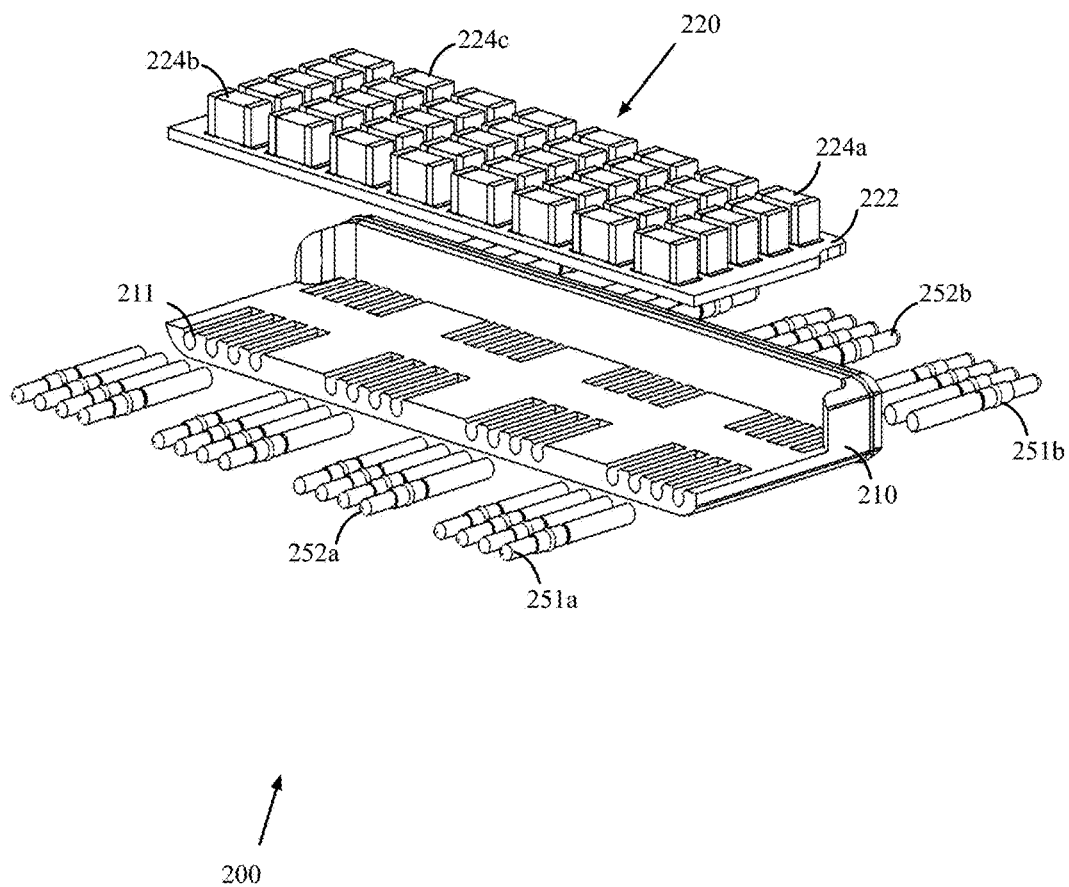
FIG. 2 is an exploded view of a pogo pin capacitor assembly according to an exemplary embodiment of the disclosure.

FIG. 2 is an exploded view of pogo pin capacitor assembly 200 according to an exemplary embodiment of the disclosure. Pogo pin capacitor assembly 200 comprises housing 210, capacitor assembly 220, and a plurality of pogo pin connectors, including exemplary pogo pin connectors 251 and 252. Pogo pin connector 251 includes distal pin 251a and distal pin 251b. Pogo pin connector 252 includes distal pin 252a and distal pin 252b. Capacitor assembly comprises printed wiring board (PWB) 222 on which a plurality of storage capacitors 224 are mounted, including exemplary capacitors 224a, 224b, and 224c. Each of the pogo pin connectors in housing 210 is disposed in one of a plurality of slots 211 in the body of housing 210. PWB 222 includes a plurality of vias and printed wiring traces on both surfaces such that selected ones of the plurality of capacitors 224 are electrically coupled to the correct ones of the plurality of pig pin connectors, such as pogo pin connectors 251 and 252.

Figure 3:
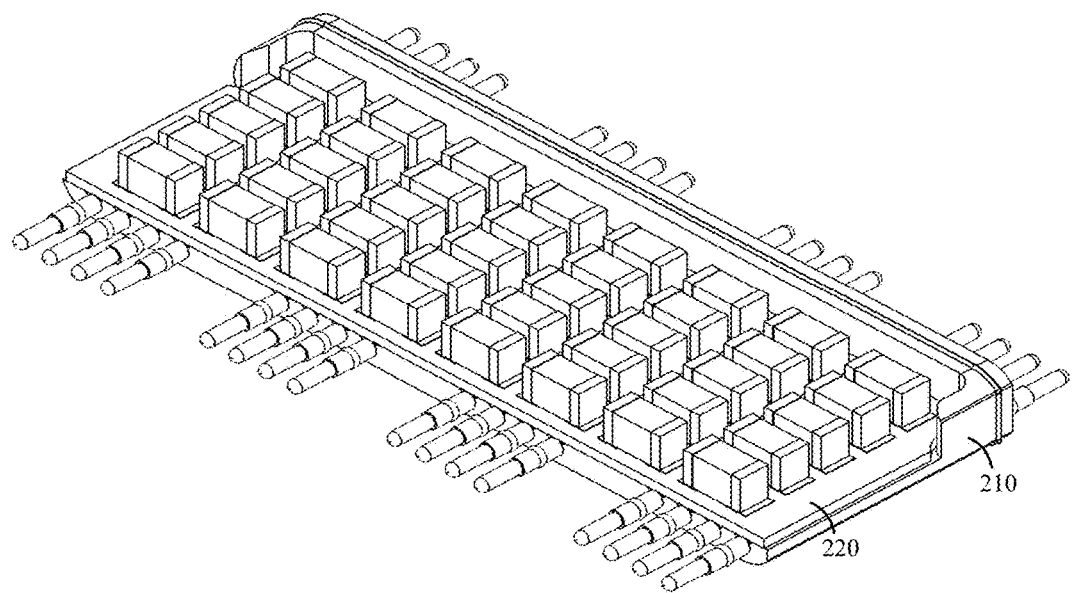
FIG. 3 is a perspective view of a pogo pin capacitor assembly with the housing cover removed according to an exemplary embodiment of the disclosure.
Figure 4:
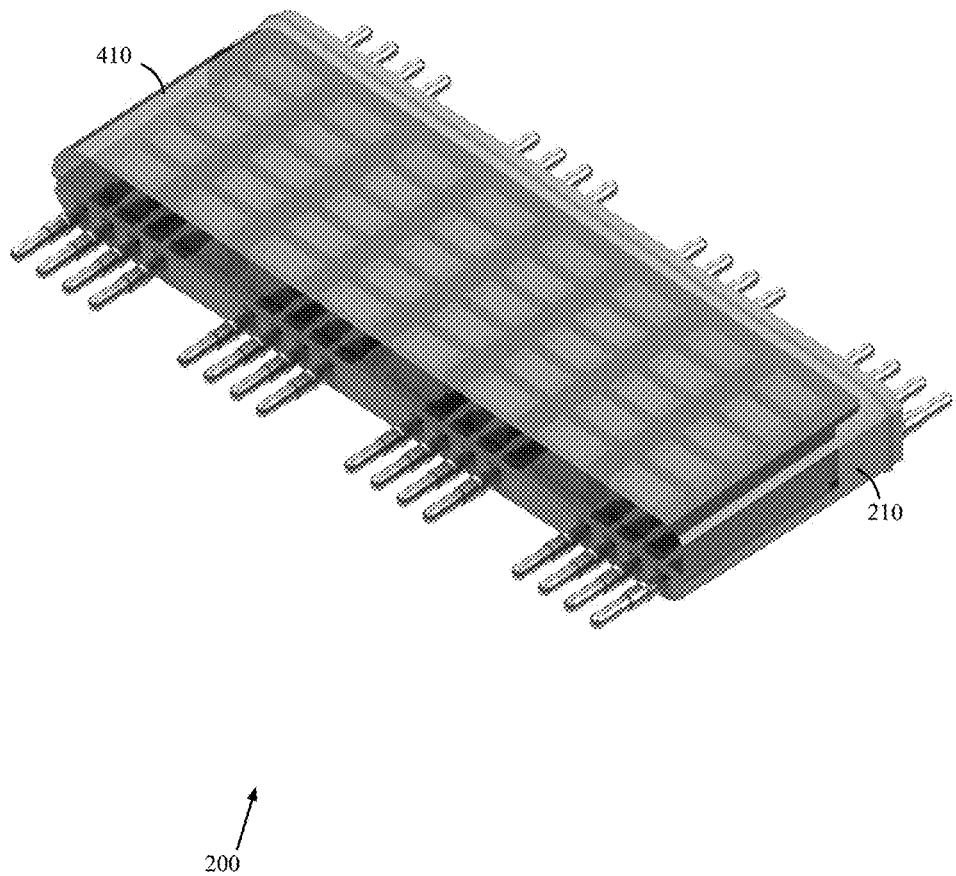
FIG. 4 is a perspective view of a pogo pin capacitor assembly with the housing cover attached according to an exemplary embodiment of the disclosure.

FIG. 3 is a perspective view of pogo pin capacitor assembly 200 with the housing cover removed according to an exemplary embodiment of the disclosure. FIG. 4 is a perspective view of pogo pin capacitor assembly 200 with housing cover 410 attached according to an exemplary embodiment of the disclosure.

In FIGS. 3 and 4, capacitor assembly 200 is mounted within housing 210 such that the printed wiring traces on the bottom surface of PWB 222 make electrical connection with the pogo pin connectors in slots 211. Pogo pin capacitor assembly 200 replaces the same volume as prior art pogo pin connector assembly 100 with a printed wiring board (or printed circuit board) carrying short pogo pins on each side. The remaining space on the back side of the PWB may be filled with capacitors. Pogo pin capacitor assembly 200 groups multiple pogo pin connector sets together to increase the capacitor space between pogo pin connectors. This embodiment better utilizes space that has already been removed from the adjacent heatsink to carry the pogo pins, while at the same time keeping the capacitance very close to the point of load.

The capacitor circuit card assembly (CCA) is combined with an alignment insulator to keep proper contact between the capacitor circuit card assembly and the pogo pin connectors during assembly and use. In an exemplary embodiment, the capacitor circuit card assemblies may be arranged in an array between the power boards and the radio frequency (RF) boards of a radar system or other high power, high-frequency system. The mounting plate may serve as both a heatsink and a holding fixture for the circuit card assemblies.

Figure 5:
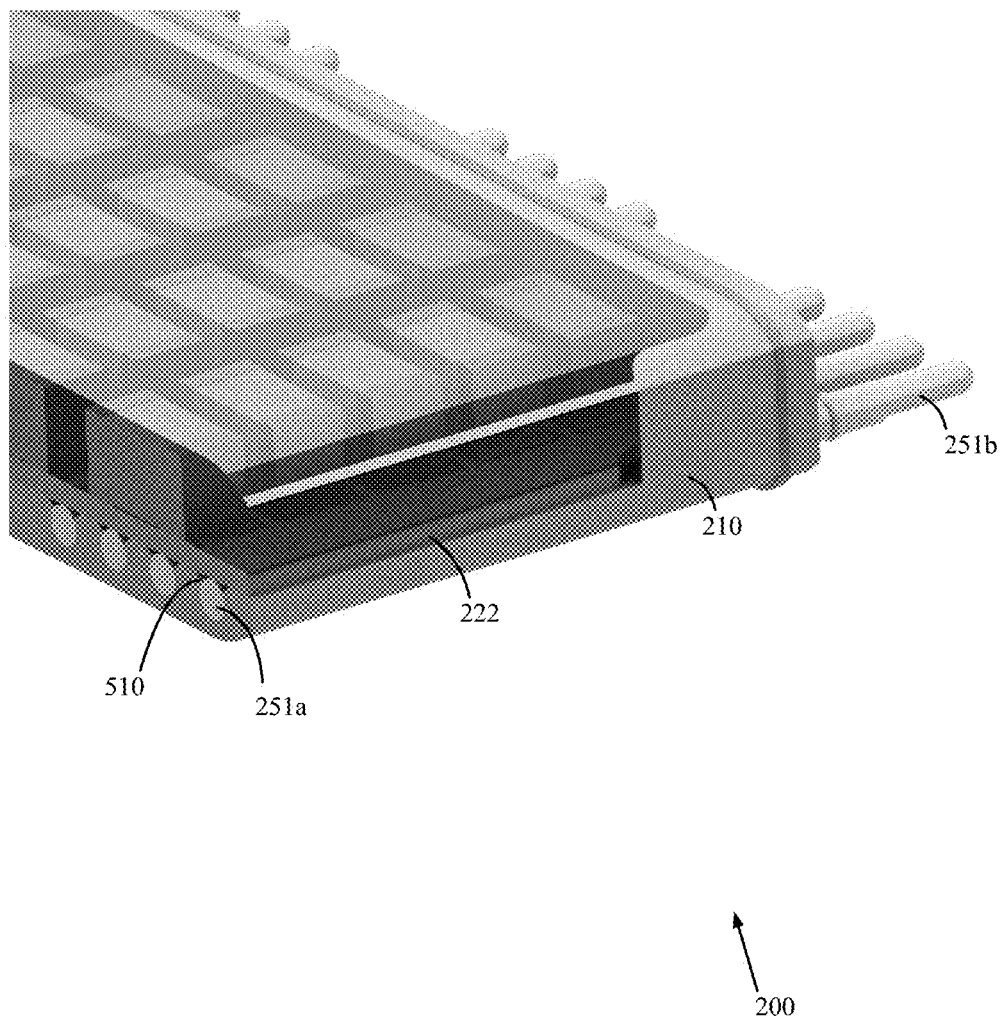
FIG. 5 is a partial cross-sectional view of a pogo pin capacitor assembly according to an exemplary embodiment of the disclosure.

FIG. 5 is a partial cross-sectional view of pogo pin capacitor assembly 200 according to an exemplary embodiment of the disclosure. In FIG. 5, the bottom surface of printed wiring board 222 of capacitor assembly 220 makes electrical contact with exemplary pogo pin connector 251. Exemplary distal end 251a of pogo pin connector 251 is soldered to a wiring trace on the bottom surface of printed wiring board 222 by solder ball 510. It is noted that in FIG. 5, capacitors 224 are mounted on only one side of the pogo pin connectors (i.e., top side). However, in an alternate embodiment (not shown), a second capacitor assembly 220 comprising a second printed wiring board 222 and a second plurality of storage capacitors 224 may be implemented in housing 210. In such an embodiment, the two capacitor assemblies 220 would be mounted on opposing sides of the pogo pin connectors (e.g., top side and bottom side), thereby increasing the density of storage capacitors in pogo pin capacitor assembly 200.

Figure 6:
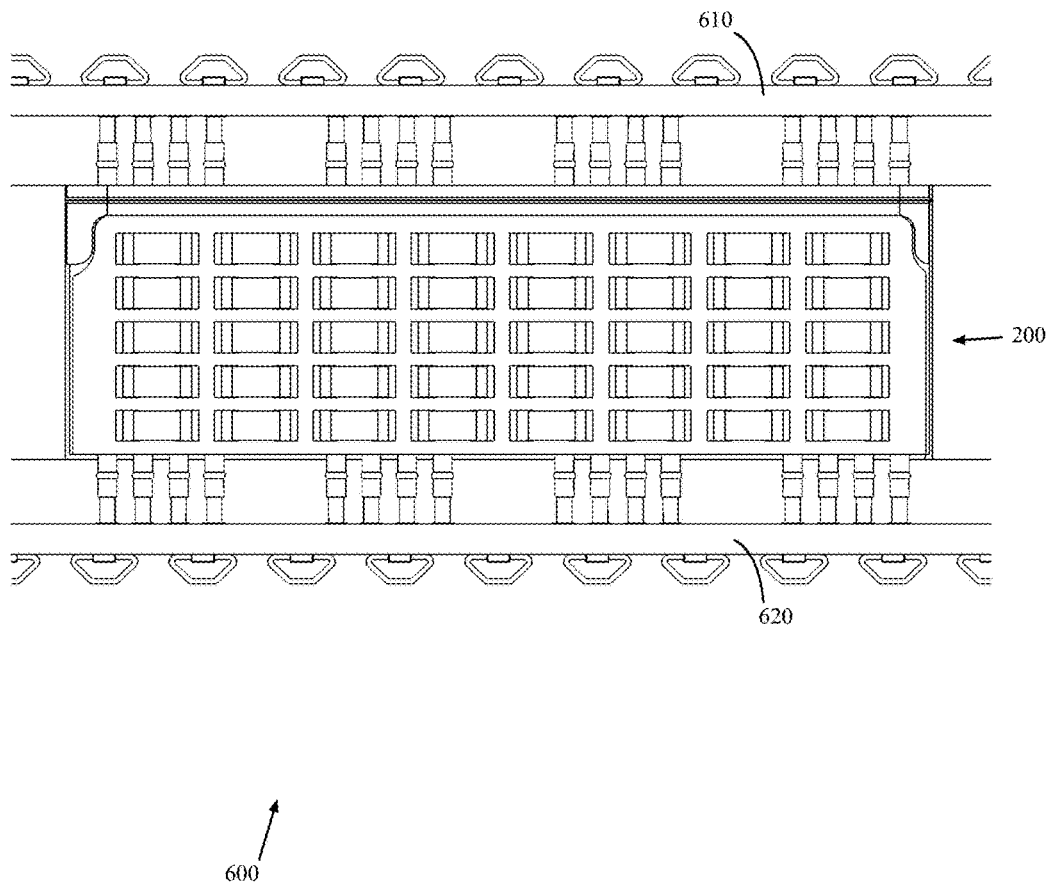
FIG. 6 is a side view of two circuit boards between which a pogo pin capacitor assembly is disposed according an exemplary embodiment of the disclosure.

FIG. 6 is a side view of two circuit boards between which pogo pin capacitor assembly 200 is disposed according to an exemplary embodiment of the disclosure. For simplicity, cover 410 is removed in FIG. 6, such that capacitors 224 are visible. Circuit board 610 and circuit board 620 are substantially parallel to each other and are shown in an edge view. Circuit board 610 may be, for example, a power board and circuit board 620 may be, for example, a high frequency RF board in a radar system. Pogo pin capacitor assembly 200 is arranged substantially orthogonally between circuit board 610 and circuit board 620, such that the opposite ends of the pogo pin connectors are inserted into vias or holes in the wire traces of circuit boards 610 and 620. As FIG. 6 illustrates, capacitors 224 are mounted in an area of unused space between circuit boards 610 and 620, thereby saving valuable board space on boards 610 and 620.

Although the present disclosure has been described with an exemplary embodiment, various changes and modifications may be suggested to one skilled in the art. It is intended that the present disclosure encompass such changes and modifications as fall within the scope of the appended claims.

What is claimed is:

1. An electrical assembly comprising:
a housing;
a plurality of pogo pin connectors disposed within and projecting from the housing; and
a plurality of storage capacitors disposed within the housing and configured to form electrical connections with selected ones of the plurality of pogo pin connectors, the storage capacitors storing energy for power delivery by the pogo pin connectors.

2. The electrical assembly as set forth in claim 1, where each of the pogo pin connectors has a longitudinal axis; and where the electrical assembly further comprises a printed wiring board on which the plurality of capacitors are mounted, the printed wiring board being disposed substantially parallel to the longitudinal axis of each of the plurality of pogo pin connectors.

3. The electrical assembly as set forth in claim 2, where the plurality of capacitors are a plurality of separate discrete capacitors mounted on the printed wiring board; and wherein wiring traces on a surface of the printed wiring board are connected to the selected ones of the plurality of capacitors.

4. The electrical assembly as set forth in claim 3, where the selected ones of the plurality of pogo pin connectors are each soldered to a wiring trace on a surface of the printed wiring board; and wherein wiring traces on a surface of the printed wiring board are soldered to the selected ones of the plurality of capacitors to electrically couple the plurality of capacitors to the selected ones of the plurality of pogo pin connectors.

5. The electrical assembly as set forth in claim 3, where the selected ones of the plurality of pogo pins are each soldered to a wiring trace on a surface of the first side of the printed wiring board by a solder ball.

6. The electrical assembly as set forth in claim 2, where the plurality of capacitors are a plurality of separate discrete capacitors mounted on a surface of the printed wiring board such that the plurality of capacitors are arranged in an array on the surface of the printed wiring board.

7. The electrical assembly as set forth in claim 2, where the printed wiring board has opposing first and second sides, the first side of the printed wiring board facing toward the plurality of pogo pin connectors and the second side of the printed wiring board facing away from the plurality of pogo pin connectors; and where the plurality of capacitors are mounted on the second side of the printed wiring board and are separated from the plurality of pogo pins by the printed wiring board.

8. The electrical assembly as set forth in claim 7, where the plurality of capacitors are mounted only on the second side of the printed wiring board and not mounted on the first side of the printed wiring board.

9. The electrical assembly as set forth in claim 1, where the housing has opposing first and second sides; where a first portion of the pogo pin connectors project outward from the first side of the housing; where a second portion of the pogo pin connectors project outward from the second side of the housing; and where the first portion of pogo pin connectors extend only partially into the first side of the housing and where the second portion of pogo pin connectors extend only partially into the second side of the housing with a space defined in the housing between the first portion of pogo pin connectors and the second portion of pogo pin connectors such that the first portion of pogo pin connectors do not meet or electrically connect within the housing to the second portion of pogo pin connectors.

10. The electrical assembly as set forth in claim 1, where each of the pogo pin connectors has a longitudinal axis; and where the electrical assembly further comprises:
   a first printed wiring board on which a first portion of the plurality of capacitors are mounted, the first printed wiring board being disposed substantially parallel to the longitudinal axis of each of the plurality of pogo pin connectors; and
   a second printed wiring board on which a second portion of the plurality of capacitors are mounted, the second printed wiring board being disposed substantially parallel to the longitudinal axis of each of the plurality of pogo pin connectors with the plurality of pogo pin connectors being disposed between the first printed wiring board and the second printed wiring board;
   where the first printed wiring board has opposing first and second sides, the first side of the first printed wiring board facing toward a first side of the plurality of pogo pin connectors and the second side of the first printed wiring board facing away from the first side of the plurality of pogo pin connectors, the first portion of the plurality of capacitors being mounted on the second side of the first printed wiring board and being separated from the plurality of pogo pins by the first printed wiring board;
   where the second printed wiring board has opposing first and second sides, the first side of the second printed wiring board facing toward a second side of the plurality of pogo pin connectors that is opposite to the first side of the pogo pin connectors, the second side of the second printed wiring board facing away from the second side of the plurality of pogo pin connectors, the second portion of the plurality of capacitors being mounted on the second side of the second printed wiring board and being separated from the plurality of pogo pins by the second printed wiring board.

11. An electronic apparatus comprising:
   a first circuit board;
   a second circuit board substantially parallel to the first circuit board; and
   an electrical assembly coupled between the first and second boards, the electrical assembly comprising:
      a housing;
      a plurality of pogo pin connectors disposed within and projecting from the housing and configured to make electrical contact with the first and second circuit boards;
      and
      a plurality of storage capacitors disposed within the housing and configured to form electrical connections with selected ones of the plurality of pogo pin connectors, the storage capacitors storing energy for power delivery by the pogo pin connectors to wire traces of at least one of the first circuit board or second circuit board.

12. The electronic apparatus as set forth in claim 11, where the first circuit board is a power board and the second circuit board is a RF board of a radar system.

13. The electronic apparatus as set forth in claim 11, where each of the pogo pin connectors has a longitudinal axis; and where the electrical assembly further comprises a printed wiring board on which the plurality of capacitors are mounted, the printed wiring board being disposed substantially parallel to the longitudinal axis of each of the plurality of pogo pin connectors, and the printed wiring board being disposed substantially perpendicular to the first and second circuit boards.

14. The electronic apparatus as set forth in claim 13, where the plurality of capacitors are a plurality of separate discrete capacitors mounted on the printed wiring board; and wherein wiring traces on a surface of the printed wiring board are connected to the selected ones of the plurality of capacitors.

15. The electronic apparatus as set forth in claim 14, where the selected ones of the plurality of pogo pins are each soldered to a wiring trace on a surface of the printed wiring board; and wherein wiring traces on a surface of the printed wiring board are soldered to the selected ones of the plurality of capacitors to electrically couple the plurality of capacitors to the selected ones of the plurality of pogo pin connectors.

16. The electronic apparatus as sit for the in claim 13, where the printed wiring board and pogo pins are arranged substantially orthogonally between the first circuit board and the second circuit board such that opposite ends of the pogo pin connectors are inserted into vias or holes in wire traces of the first and second circuit boards.

17. The electronic apparatus as set forth in claim 13, where the printed wiring board has opposing first and second sides, the first side of the printed wiring board facing toward the plurality of pogo pin connectors and the second side of the printed wiring board facing away from the plurality of pogo pin connectors; where the plurality of capacitors are mounted on the second side of the printed wiring board and are separated from the plurality of pogo pins by the printed wiring board; and where the plurality of capacitors are mounted only on the second side of the printed wiring board and not mounted on the first side of the printed wiring board.

18. A method, comprising:
   storing energy in a plurality of storage capacitors disposed within a housing of an electrical assembly coupled between a first circuit board and a second circuit board, the plurality of storage capacitors being electrically connected to selected ones of a plurality of pogo pin connectors disposed within and projecting from the housing to make electrical contact with the first and second circuit boards, and the second circuit board being oriented substantially parallel to the first circuit board; and delivering power from the storage capacitors to wire traces of at least one of the first circuit board or the second circuit board via the plurality of pogo pin connectors.

19. The method as set forth in claim 18, where the first circuit board is a power board and the second circuit board is a RF board of a radar system.

20. The method as set forth in claim 18, where each of the pogo pin connectors has a longitudinal axis; and where the electrical assembly further comprises a printed wiring board on which the plurality of capacitors are mounted, the printed wiring board being disposed substantially parallel to the longitudinal axis of each of the plurality of pogo pin connectors.

21. The method as set forth in claim 20, where the printed wiring board and pogo pins are arranged substantially orthogonally between the first circuit board and the second circuit board such that opposite ends of the pogo pin connectors are inserted into vias or holes in wire traces of the first and second circuit boards.

22. The method as set forth in claim 20, where the printed wiring board has opposing first and second sides, the first side of the printed wiring board facing toward the plurality of pogo pin connectors and the second side of the printed wiring board facing away from the plurality of pogo pin connectors; where the plurality of capacitors are mounted on the second side of the printed wiring board and are separated from the plurality of pogo pins by the printed wiring board; and where the plurality of capacitors are mounted only on the second side of the printed wiring board and not mounted on the first side of the printed wiring board.

23. The method as set forth in claim 20, where the plurality of capacitors are a plurality of separate discrete capacitors mounted on the printed wiring board; where the selected ones of the plurality of pogo pins are each soldered to a wiring trace on a surface of the printed wiring board; and wherein wiring traces on a surface of the printed wiring board are soldered to the selected ones of the plurality of capacitors to electrically couple the plurality of capacitors to the selected ones of the plurality of pogo pin connectors.

* * * * *